(12) United States Patent
Clement et al.

(10) Patent No.: US 6,483,117 B1
(45) Date of Patent: Nov. 19, 2002

(54) SYMMETRIC BLANKING FOR HIGH STABILITY IN ELECTRON BEAM EXPOSURE SYSTEMS

(75) Inventors: Clay S. Clement, Rock Tavern, NY (US); Michael S. Gordon, Lincolndale, NY (US); Rodney A. Kendall, Ridgefield, CT (US); Werner Stickel, Ridgefield, CT (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/335,043

(22) Filed: Jun. 16, 1999

(51) Int. Cl.[7] .............. H01J 3/14; A61N 5/00; G21G 5/00
(52) U.S. Cl. .............. 250/396 R; 250/492.1; 250/492.2
(58) Field of Search .......... 250/396 R, 492.2, 250/492.1, 492.22

(56) References Cited

U.S. PATENT DOCUMENTS

| | | | | |
|---|---|---|---|---|
| 4,199,689 A | * | 4/1980 | Takigawa | 250/492.2 |
| 5,250,812 A | * | 10/1993 | Murai et al. | 250/398 |
| 5,291,240 A | * | 3/1994 | Jain | 355/53 |
| 5,886,357 A | * | 3/1999 | Kojima | 250/492.23 |
| 5,932,884 A | * | 8/1999 | Aizaki | 250/492.23 |
| 6,121,625 A | * | 9/2000 | Ito et al. | 250/492.22 |

FOREIGN PATENT DOCUMENTS

JP  62-180946  8/1987

OTHER PUBLICATIONS

62–180946 (Abstract) Japan, filed Aug. 8, 1987.

\* cited by examiner

*Primary Examiner*—John R. Lee
*Assistant Examiner*—David A. Vanore
(74) *Attorney, Agent, or Firm*—Whitham, Curtis & Christofferson, P.C.

(57) ABSTRACT

An electronic beam lithography tool providing dimensional stability. The tool includes three or more deflection plates above an aperture diaphragm which allows the beam to be deflected away from an aperture and along a two-dimensional locus on the aperture diaphragm which is approximately symmetrical around the aperture therein. By doing so, the aperture diaphragm is symmetrically heated by the power of the charged particle beam and the geometry of the charged particle beam device is stabilized against variance in geometry of the device to a very small tolerance.

20 Claims, 5 Drawing Sheets

SYMMETRIC BLANKING FOR HIGH STABILITY IN ELECTRON BEAM EXPOSURE SYSTEMS

BACKGROUND OF THE INVENTION

1. Field of the Invention

The present invention generally relates to electron beam lithography tools and, more particularly, to electron beam projection lithography tools of high throughput for semiconductor integrated circuit manufacture.

2. Description of the Prior Art

It has been recognized that increasing integration density and device proximity can enhance both performance and manufacturing economy of integrated circuits. Accordingly, device dimensions therein have been scaled to smaller design rules and feature size regimes to the limit of available lithographic processes to define device dimensions and locations. At the present state of the art, lithographic resists must be exposed with electron beams to produce feature sizes and resolutions that allow improved performance and manufacturing economies to be realized to the greatest possible extent.

The manufacturing economies at increased integration density generally derive from the fact that smaller device dimensions allow increased numbers of devices to be formed on chips which are diced from a wafer subjected to a sequence of processing steps. Thus the process cost is distributed over a greater number of devices. However, a greater number of devices per chip implies an increase in the number of pixels to be exposed by a similar factor. At the present state of the art, the number of pixels which must be exposed on a single chip can exceed one billion or more while the number of pixels that can be simultaneously exposed by a single exposure of an electron beam projection system is limited to a few hundred thousand or few million. Therefore, several hundred to several thousand individual exposures must be made in rapid sequence for a single high density integrated circuit chip and the electron beam must be blanked between exposures.

Thus for acceptable levels of throughput for electron beam exposure tools, exposure time must be short and beam energy and exposure current must be high. Blanking by altering potential on a grid in the manner of cathode ray tubes is not feasible in view of the high voltage required to stop the beam relative to the available slew rate of amplifiers, the potential for causing variability of electron flux of the beam and the alteration of thermal conditions of the exposure tool when the beam is stopped. Accordingly, blanking is generally accomplished by deflecting the beam away from an aperture in one or more plates which intercept the beam. The power in the beam may be up to several hundred watts, most of which must be dissipated at aperture stops along the beam path, particularly when the beam is blanked and the plate (often referred to as an aperture diaphragm) surrounding the aperture prevents the beam from reaching the target (e.g. wafer).

It should also be appreciated that electron beam projection systems must be extremely stable dimensionally since the positional error tolerable in an exposure is a fraction of the minimum feature size to be produced so that the respective patterns in adjacent exposure areas can be adequately stitched together for electrical continuity. Accordingly, any positional variation in the concentrated, focused, high power beam is a potential source of instability due to the location(s) where the beam is at least partially incident and fraction of the beam power which must be dissipated at such location (s).

For blanking, substantially the entire beam power is dissipated at the location on the blanking aperture or aperture diaphragm to which the beam is deflected. The blanking duty cycle is dictated by the operational conditions of the system and thus cannot be altered to limit power dissipation. The location available on the blanking aperture to which the beam can be deflected is also limited in range to a region between a small multiple of the beam diameter (to assure complete beam stoppage) and a maximum deflection limited by deflector sensitivity and available deflector excitation power.

Standard blanking arrangements deflect the beam in a meridianal plane and limits the area of the aperture diaphragm which is heated by the beam to one side of the aperture therein; invariably leading to a lateral shift of the aperture and an alteration of beam position at the target by a distance which, in most cases, will be significant relative to or exceed the minimum feature size of the integrated circuit design and thus prevent correct stitching of sub-field patterns or cause blurring or uneven intensity of the image due to aperture motion with temperature change that is reflected in beam position. Depending on the blanking period, the aperture diaphragm can be destroyed or partially melted due to the extreme power density over a limited area.

(A hollow beam technique as disclosed in U.S. Pat. No. 5,834,783 where the hollow beam is developed by a blocking disk suspended in an aperture of the aperture diaphragm with delicate spokes would be even more severely affected. With such an annular aperture, uneven heating of the spokes severely distorts the beam while the blocking disk is less able to dissipate heat.)

More generally, it should be appreciated that the significance of any dimensional instability of the electron beam projection system is related to the minimum feature size which must be produced and the effects described in the preceding paragraphs, although potentially foreseeable, may be negligible or undetectable for some sub-micron feature size regimes close to the current state of the art. That is, when maximum integration density and highest throughput levels are not aggressively pursued, adequate levels of throughput can be achieved at, for example, quarter-micron feature sizes at beam current levels and blanking duty cycles which would ordinarily maintain any shift of beam position location to dimensions which are a small fraction of a quarter-micron, if detectable at all. However, the inventors have found that when minimum feature size and maximum throughput are aggressively pursued (e.g. a 0.1 micron minimum feature size and beam power levels of 5 KW/cm$^2$ or more), the beam location shift may become quite significant, as will be more quantitatively discussed in connection with a description of the invention and, moreover, damage to elements of the e-beam exposure system may result.

Accordingly, it is seen that known blanking techniques do not adequately support acceptable levels of throughput at currently feasible and future feature sizes in integrated circuit manufacturing processes. No alternative has existed other than increased deflector excitation power and even that expedient would be of limited effectiveness to reduce the above-described effects on dimensional stability of the tool.

SUMMARY OF THE INVENTION

It is therefore an object of the present invention to provide a technique of blanking an electron beam in an electron beam lithography tool which does not cause distortion of the geometry and provides stability to the geometry thereof.

It is a further object of the invention to provide a method of operating an electron beam projection lithography tool and method of manufacturing high-density integrated circuits with improved positional accuracy and sub-field stitching at high throughput.

In order to accomplish these and other objects of the invention, a method of operating a charged particle beam device and manufacturing semiconductor integrated circuits is provided including steps of generating a beam of charged particles at an aperture in an aperture diaphragm, deflecting the beam of charged particles away from the aperture, deflecting the beam along a locus on a surface of the aperture diaphragm which is approximately symmetrical around the aperture, and deflecting the beam from a location on the locus to the aperture.

In accordance with another aspect of the invention, an apparatus for blanking an electron beam is provided including an aperture diaphragm having an aperture, a source providing a charged particle beam at the aperture, and an arrangement located above the aperture diaphragm for deflecting the charged particle beam in a two-dimensional pattern on the aperture diaphragm along a locus spaced approximately symmetrically around the aperture in the aperture diaphragm.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
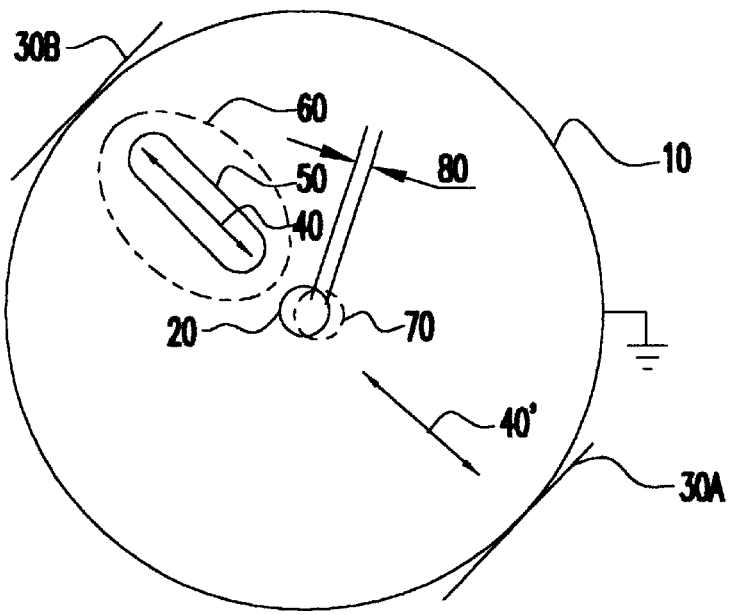
FIG. 1 is a plan view of a blanking aperture diaphragm with a currently employed beam blanking path superimposed thereon, useful for comparison with the invention and conveying an understanding of the problems addressed thereby.

Referring now to the drawings, and more particularly to FIG. 1, there is shown, in plan view, an aperture diaphragm or blanking plate 10 as currently used in electron beam lithography tools, including tools for electron beam projection lithography. It should be understood that the depiction of FIG. 1 is arranged to convey an appreciation of the problems addressed by the invention and the distinction of the principles of the invention from current practices. Accordingly, no portion of FIG. 1 is admitted to be prior art in regard to the present invention. Rather, FIG. 1 is intended only to provide a summary overview of the blanking techniques over which the present invention presents a significant improvement.

In this regard and as alluded to above, it should also be appreciated that the problem addressed by the invention relates to a dimensional instability of electron beam lithography tools which is not present in exposure tools using electromagnetic radiation or is not significant in e-beam exposure tools at larger feature size regimes. The effect of the problem was negligibly small relative to lithographic feature sizes at the state of the art of semiconductor manufacturing using electron beam lithography only a very short time ago and possibly even unobserved, particularly at lower beam power than is presently necessary for acceptable tool throughput. Nevertheless, at the present state of the art and for foreseeable minimum feature size regimes, dimensional stability of the electron beam tool has become crucial to the feature sizes which can be produced in integrated circuit designs at acceptable yields.

As alluded to above, features sizes of 0.1 micron or less are possible at the current state of the art of electron beam projection lithography and dimensional stability must be maintained to a relatively small fraction of the minimum feature size to be produced. At the same time, the width of the annulus formed by the blanking aperture diaphragm (between the aperture perimeter and the outer periphery thereof) may be on the order of several inches and may be subjected to temperature excursions between ambient and the melting point of the material of which it is made. Generally, blanking aperture diaphragms are made from refractory metals to have good conduction of both heat and electricity while withstanding high temperatures. The coefficient of thermal expansion of such materials is not exceptionally low although the Young's modulus of such materials may be moderately high.

For example, computer simulation of a representative configuration (a solid graphite cylinder with an aperture hole) has shown that linear deflection of a beam with 5 KW/cm$^2$ power density concentrated in a spot with 0.5 mm diameter would not only shift the aperture location by 0.3 micrometers, which is significant, but, more importantly, raise the local temperature to a degree which would immediately lead to destruction of the unit.

The aperture diaphragm 10, as shown in FIG. 1 (and FIG. 2) has a small aperture 20 centrally located therein which is approximately the same diameter of the beam. The beam may have some diffuse fringes which the aperture may truncate but the aperture diameter is intended to pass virtually all of the beam current that is well-controlled to the desired beam size and shape when the beam is centrally incident thereon.

For purposes of blanking the beam in a very short time (e.g. about 100 nsec. and less), deflection plates 30A and 30B are provided. When a suitable voltage is imposed thereon, the beam is deflected away from aperture 20 by a sufficient distance that no significant beam current (or fringe thereof) is incident upon the aperture, thus effectively blanking the beam so that no significant current reaches the target (e.g. wafer and resist thereon) and without otherwise controlling beam current.

The blanking deflection is done in a meridianal plane, as alluded to above, which can be arbitrarily oriented. Since deflection is confined to a plane by the use on only a single pair of deflection plates 30A, 30B, the points at which the blanked beam can impinge on the aperture diaphragm 10 lie along a straight line 40. It has been preferred to cause blanking deflection to only one direction away from the aperture in the interest of simplicity of deflector design and deflection drive signal circuitry but, theoretically, line 40' is available for points of impingement of the electron beam, as well. However, as can be seen, the beam cannot be moved from line 40 to line 40' without crossing the aperture and unblanking the beam. Thus, for any single blanking period, the beam is confined to a relatively small region of the aperture diaphragm which is necessarily located asymmetrically such that dimensional changes with temperature will be confined to a given direction and, hence, maximized.

In view of the power and current of beams that are in use for acceptable throughput, it is very desirable to avoid stoppage of the beam deflection during blanking which would concentrate the beam and be likely to damage the blanking aperture structure. Therefore, the beam could be preferably kept in motion back and forth along line 40 (or 40') such that the beam current can be distributed over the maximum possible area 50. The power of the beam is thus more or less evenly distributed over area 50 which causes an elevated temperature of a region, generally depicted by dashed line 60 (which will approximate a locus of points of equal temperature, referred to as an isotherm) but may be sufficient to avoid damage to the blanking aperture at low beam current.

If this technique were to be used in a modern electron beam projection lithography tool having high beam power density (e.g. 5 KW/cm$^2$ or more over a region of about 0.5 mm square) the temperature of area where the beam is incident will rise very rapidly (e.g. by thousands of degrees in 50 msec. or less). Even when the beam is moved rapidly along path 40, the temperature at a well-separated distance for the locus of beam incidence (e.g. isotherm 60) may be elevated by many hundreds of degrees centigrade at relatively low blanking duty cycles and with all practical heat removal techniques employed.

Since the aperture diaphragm will be made of a material having a finite coefficient of thermal expansion, such excursions of temperature will cause significant expansion within and in the vicinity of isotherm 60, as discussed above. While different arrangements may used for mounting the aperture diaphragm within the electron beam column and may be more or less rigid or otherwise adapted to minimize the effects of differential thermal expansion within the aperture diaphragm 10, some lateral shift to position 70 of aperture 20 by a distance 80 is unavoidable, particularly for the-beam power levels which are currently required for acceptable tool throughput.

It can be understood that, regardless of the configuration of the mounting arrangement, the mounting arrangement itself will inevitably function as a thermal conductor for sinking heat away from the aperture diaphragm 10 and, in so doing, will also experience substantial temperature excursions. Accordingly, for the beam power levels now required and resulting local temperature excursions, dimension 80 cannot be held to required limits imposed by feature size regimes otherwise possible from electron beam projection lithography tools.

Figure 2:
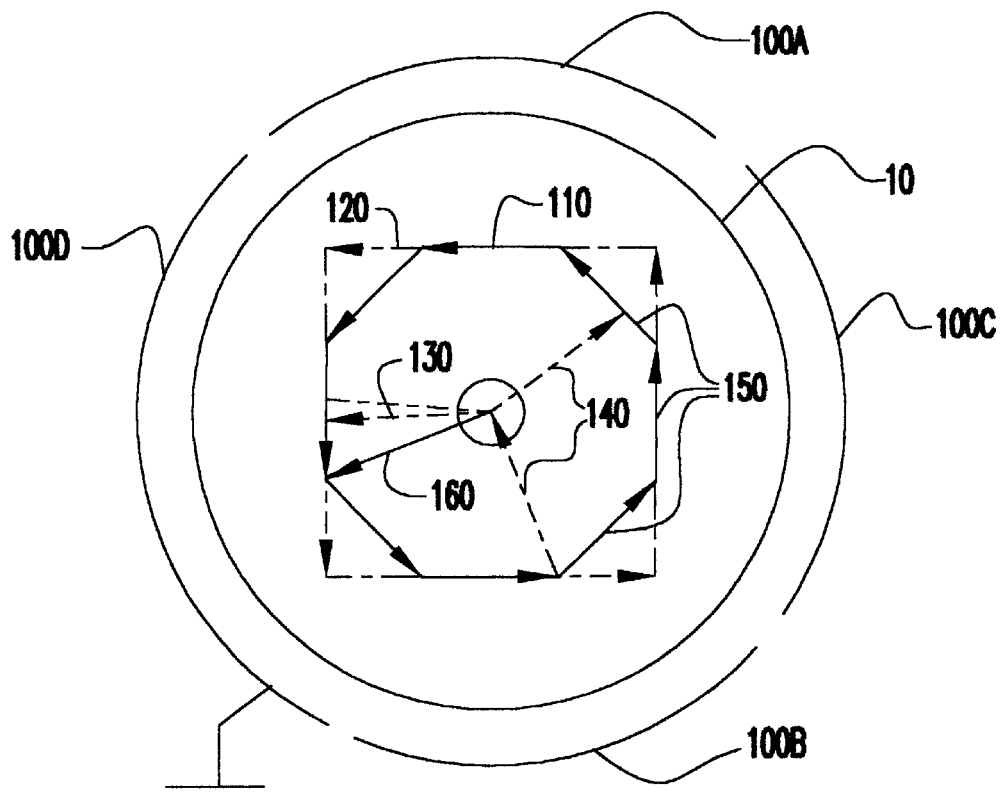
FIG. 2 is a plan view of a blanking aperture diaphragm with several exemplary beam blanking paths in accordance with the invention superimposed thereon.
Figure 3:
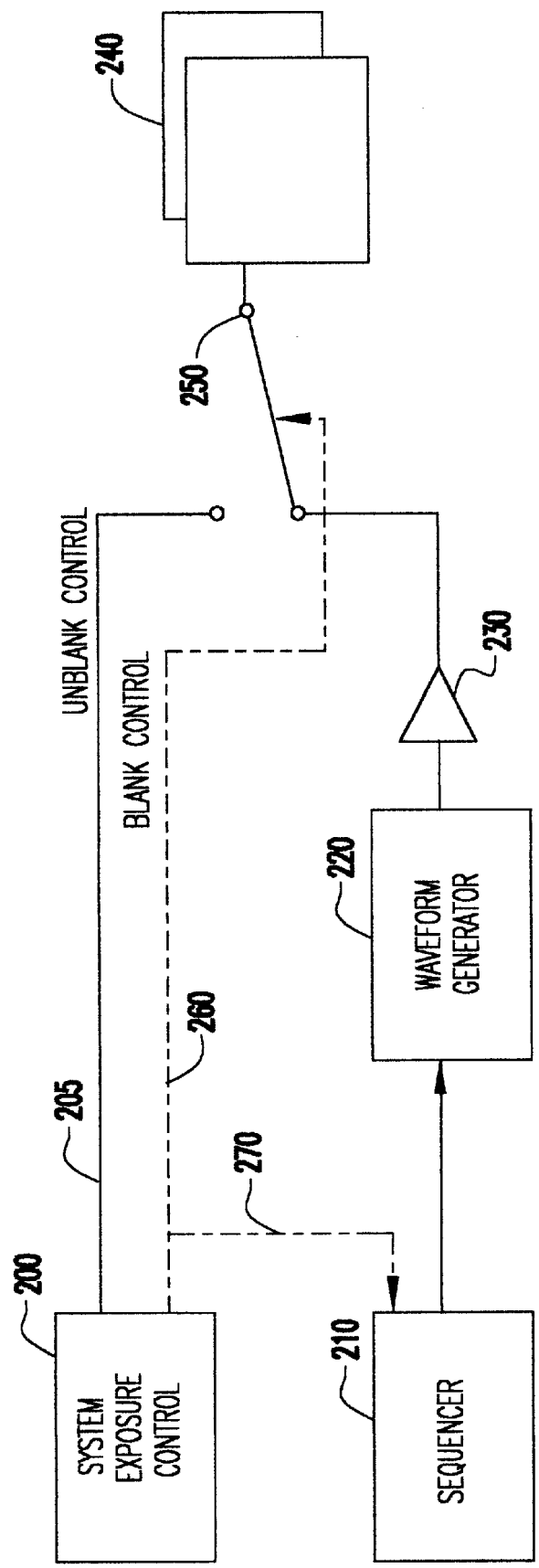
FIG. 3 is a highly schematic block diagram of exemplary functional elements which could be employed in carrying out the invention depicted in a manner useful for conveying and understanding of the principles of the practice of the invention.

Referring now to FIGS. 2 and 3 the solution to the above problem provided by the present invention will now be discussed. In comparison with FIG. 1, FIG. 2 shows the use of four electrostatic deflection plates 100A–100D which are preferably arcuate with each plate extending slightly less than ninety degrees around the beam axis as distinguished from the single pair of deflection plates of FIG. 1. (These plates are shown in FIGS. 1 and 2 at a spacing larger than the aperture diaphragm diameter in the interest of clarity but, in practice, would be more closely spaced about the beam and above the plane of the aperture diaphragm.) Thus, in accordance with the invention, the deflection plates 100A–100D are capable of deflecting the beam in two orthogonal directions in a two-dimensional pattern, rather than the beam being confined to line 40 (or line 40') as discussed above in regard to the prior blanking arrangement illustrated in FIG. 1.

The basic principle of the invention is to provide a blanking deflection pattern which is a closed geometrical figure disposed substantially symmetrically around the aperture 20 and at a distance from aperture 20 at least as great as the minimum distance for substantially complete blanking, as described above, but preferably as large as possible, consistent with acceptable power consumption in deflection drive circuitry. A larger deflection pattern will both distribute beam power over a larger area (e.g. longer path at a constant transverse dimension of the beam) closer to the edge of the aperture diaphragm where it is most likely to be supported by structures which will sink heat. Heating closer to the edge will also produce expansion near the edge of the aperture diaphragm and thus cause tensile stresses inside the region of most elevated temperature and thus minimizing any tendency toward cupping or dishing of the aperture diaphragm that would move the aperture 20 axially in the system.

It can be appreciated that a circular pattern centered about the system axis would provide complete symmetry and regularity of heating of aperture diaphragm 10. As is well-understood in the art, a circular pattern could be achieved by applying sine and cosine excitation functions to the respective pairs of deflection plates 100A, 100B and 100C, 100D. However, a circular pattern presents major practical difficulties if, indeed, such a pattern is possible to obtain in view of the bandwidth requirements for driver circuits that must be capable of completely blanking the beam in 100 nanoseconds or less. Therefore, excitation with analog deflection functions is not preferred and, in any event, may not provide a practical advantage relative to the preferred embodiments of the invention which will be described below since the heat sinking provided by support structure for the aperture diaphragm 10 may not be in the form of a similar full circle.

It has been found, by the inventors, entirely sufficient to the practice of the invention in accordance with its basic principles discussed above, to approximate a circular locus with a closed, two-dimensional polygon 110. Virtually any closed polygonal shape can be used although a triangle may be difficult to maintain between minimum and maximum distances from the aperture and thus might risk partial unblanking of the beam. An octagon 110 or even a square 120 is much preferred to other polygons since the number of voltages necessary for excitation are much reduced relative to other closed figures and proper excitation can be achieved in a very simple manner which will now be described in connection with FIG. 3. Polygons with more than eight (e.g. sixteen) sides would require complication of the deflection plate arrangement, the drive circuitry or both while not yielding significant further improvement commensurate therewith.

The system exposure control element 200 need not be significantly modified from that used currently in electron beam exposure tools, whether of the probe-forming or projection type; to which the invention is equally applicable. As depicted for clarity and to facilitate an understanding of the invention, the system exposure control element 200 (at least conceptually) has two output states, depicted as two outputs, for clarity. Output 205 provides voltages (e.g. ground) to the blanking deflectors to disable them when the beam is not to be blanked and an exposure is to be made so that the beam is coaxially incident upon aperture 20. The other output 260, in currently used systems, provides excitation voltages to deflector plates 30A, 30B to provide deflection over locus 40 of FIG. 1 or to enable some other circuit to do so. In the present invention, only such an enablement signal indicative of blanking need be provided to effectively control switching 250 between voltages that cause the beam to illuminate aperture 20 or impinge upon the aperture diaphragm along polygonal locus 110.

To produce a square or octagonal locus (or any other number of sides which is an integral power of two) it is only necessary to provide a sequencer 210, such as a low radix counter (e.g. four or eight) of two or three stages and to derive voltages in accordance with the count. For example, the count could be used to address a (read only) memory to provide selection signals for the voltages to be connected to the deflection drivers at any given time. Thus waveform generator 220 need not provide anything more than a source of the two voltages (for a square or octagon), sufficient switching to connect these voltage levels or their complements to the proper deflection plates 240 or their drivers 230 and a small memory or signal or code conversion arrangement to control the switching responsive to sequencer 210.

In operation, it has been found substantially irrelevant which of two modes of blanking is employed or any mode that can be considered as being a combination thereof or within a continuum of modes of operation between them. Specifically and with reference again to FIG. 2, to unblank the beam for making an exposure, a signal on output 260 of system exposure control element 200 causes switch 250 to connect voltages to the deflection plates which will cause the beam to divert from the blanking polygon locus 110 to the aperture 20 for the desired exposure period and then back to the blanking polygon locus 110 along path 140. Of course, this mode of operation does not illuminate or heat some portions 150 of the polygonal locus 110 during exposure and thus results in somewhat asymmetrical heating during the short exposure times.

Some of the slight asymmetry of the above-described mode of operation could be simply avoided by using the blanking signal 260 to disable the sequencer 210, as depicted at 270 so that the beam would return to the same position on the polygonal locus from which it had been deflected at the time an exposure was to be made (e.g. along dashed lines 130 which are intended to depict opposite directions of beam deflection along the same locus). However, this mode of operation does not provide exact symmetry during the exposure period since some heating will occur along locus 130 (while unblanking and re-blanking) while no heating will occur on the locus 110 during the exposure period, although heating along locus 130 is extremely brief.

Substantially exact symmetry of heating could, however, be achieved if exposure periods approximate multiples of a single time period and the time required to traverse the entire blanking polygon locus approximately conformed to (e.g. be made slightly less than) that time period. Under such conditions, which may not always be possible for a given sequence of exposures, the beam would always return to substantially the same location on the blanking polygon 110 from which it had been deflected to make an exposure even without the control depicted at 270 with the slight difference in position and lack of heating during exposure substantially compensated heating along paths 130. However, any advantage over other modes of operation of the invention described above is expected to be very slight while the asymmetry of heating described in the preceding paragraphs are not expected to be significant. Under conditions where such substantially exact symmetry could be produced, there would be no trade-off in terms of hardware, operating costs or design or exposure constraints. Conversely, if the slight additional stability were found critical, the only exposure constraint would be that exposure times be multiples of the time to trace the blanking polygon (or a fraction thereof at randomized intervals) and which can be adjusted at will.

Figure 4:
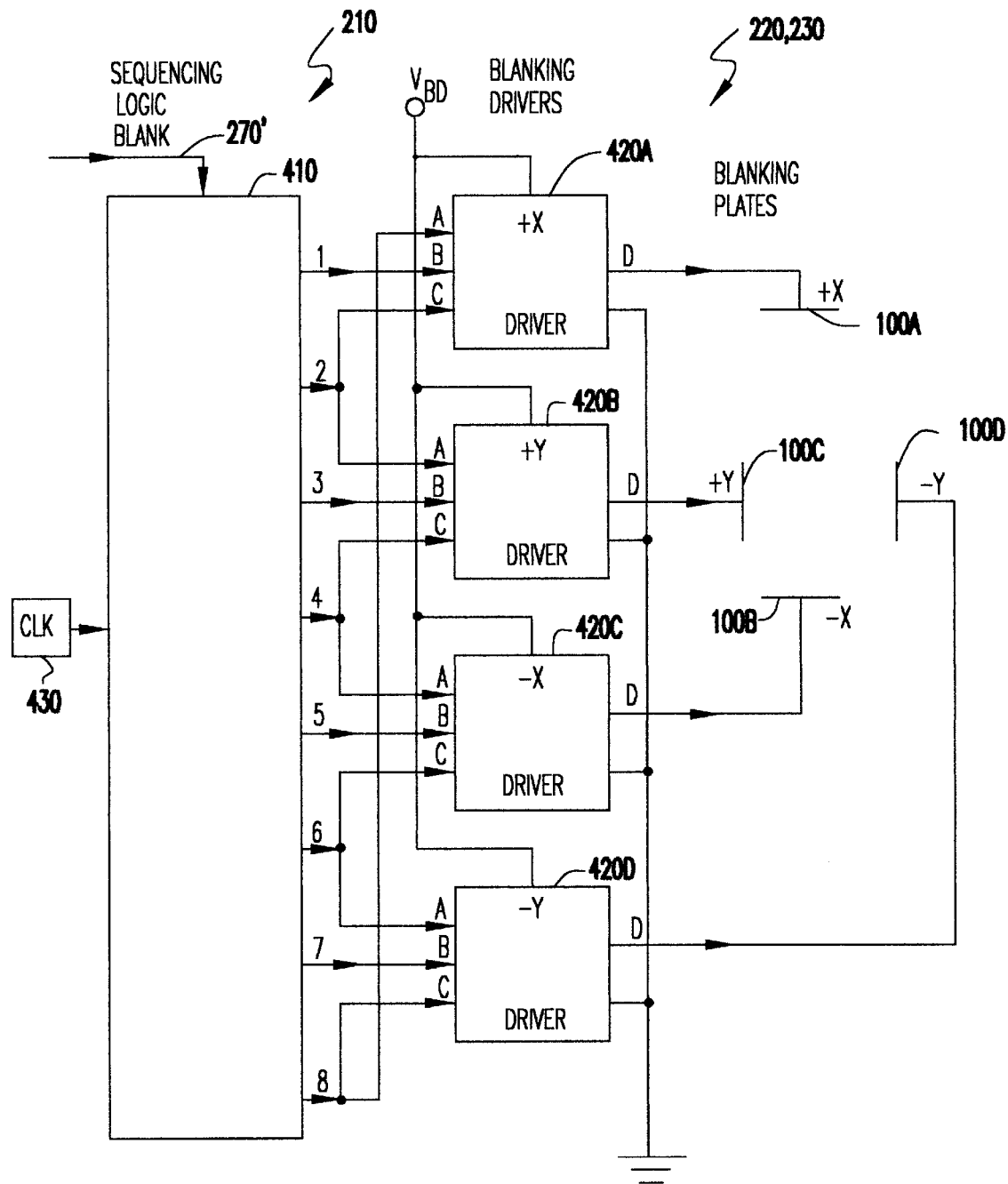
FIG. 4 is a block diagram of a preferred embodiment of the invention by which it is preferably implemented and practiced.

Having described the principles of the invention and preferred arrangements for the practice thereof, the preferred deflection arrangement for practicing the invention in a production environment will now be described with reference to FIG. 4. As depicted in FIG. 4, sequencing logic 410 corresponds to sequencer 210 of FIG. 3 and drivers 420a–420d correspond to both the waveform generator 220 and driver amplifier 230 of FIG. 3. In accordance with the preferred implementation of the invention, deflection plates 100A–100D are driven individually rather than in differential push-pull pairs.

The sequencing logic is preferably arranged to provide an output as a 1-of-8 code wherein only one output is active at any instant. That is, the output of sequencing logic 410 substantially emulates a commutator. All outputs are deactivated by blanking signal 270', generally corresponding to control signal 270 of FIG. 3, described above. The inputs of drivers 420a–420d (as illustrated) are effectively ORed such that any active input to a given driver will control a switch, resulting in a blanking deflection voltage, $V_{BD}$, being applied to the output of the respective driver. If no input to a given driver is active, the driver will connect the corresponding blanking deflection plate to a reference voltage (e.g. ground or a voltage that centers the beam on aperture 20). As will be understood in the art, the blanking deflection plates 100A–100D present a small capacitive load and will charge to $V_{BD}$ over a very short interval, deflecting the beam over a linear segment of polygon 110 at an approximately linear rate.

Thus, as outputs of sequencing logic 410 are sequentially activated and deactivated, voltages are applied to deflection plates in the sequence of 100A (+X), 100A and 100C (+X,+Y), 100C (+Y), 100C and 100B (–X,+Y), 100B (–X), 100B and 100D (–X, –Y), 100D (–Y), 100D and 100A (+X, –Y), and repeating for the duration of the blanking interval. To provide a square blanking polygon, the sequencing logic 410 need have only four outputs corresponding to the "B" inputs of drivers 420a–420d and ORing of the driver inputs would not be required.

In much the same manner, other polygonal shapes of the blanking locus 110 (e.g. triangle, pentagon, hexagon and the like) can be provided with reasonable convenience by providing a number of deflection plates equal to or a submultiple (e.g. half) of the number of sides of the polygon to be produced and applying a voltage to each of the plates in sequence or a sequence of combinations as discussed with respect to a square or octagon, respectively. However, production of an octagon using four deflection plates is considered to be most hardware-efficient with adequate operating margins against partial unblanking of the beam.

While the design of switches comprising drivers 420a–420d is not particularly critical to the practice of the invention and the design of suitably high-speed switches will be evident to those skilled in the art, it should be appreciated that switches are preferred to amplifiers. Amplifiers would be used to perform deflection using sine and cosine signals for rotational blanking and providing a circular closed shape of the beam locus for blanking. However, amplifiers cannot provide needed slew rates for blanking/ unblanking transitions when the beam transitions between the blanking locus 110 and aperture 20.

Amplifiers can also drift during the unblanking period resulting in unacceptable variation in symmetry of beam position, intensity and current density across the beam cross-section (since the beam would not be exactly centered on aperture 20 when unblanked or deflected symmetrically about the aperture when unblanked). Further, even switching between amplifiers (accommodating sine and cosine deflection signals) and a fixed voltage for unblanking would require that deflection plates be driven to both positive and negative voltages during blanking, unnecessarily complicating amplifier and power supply design while deriving little or no benefit.

It is also preferred to select the next blanking position during the transition when the beam is unblanked. Doing so will avoid or minimize delay and potential exposure time error when the beam is again blanked. In such a case, if the beam is unblanked along locus 130 in FIG. 2, the subsequent blanking operation will return the beam to the blanking polygon 110 along path 160. Providing this function is a simple matter of using the transition of the blanking signal to increment the sequencing logic, for example, by ORing the blanking signal with a timing signal from clock 430 which causes the sequencing logic to cyclically activate its outputs. Again, the details of the arrangement for doing so and the particular function are not critical to the practice of the invention. For example, the blanking signal could be applied to reset the sequencing logic 410 so that the sequence would always begin at a consistent location on the blanking polygon.

Figure 5A:
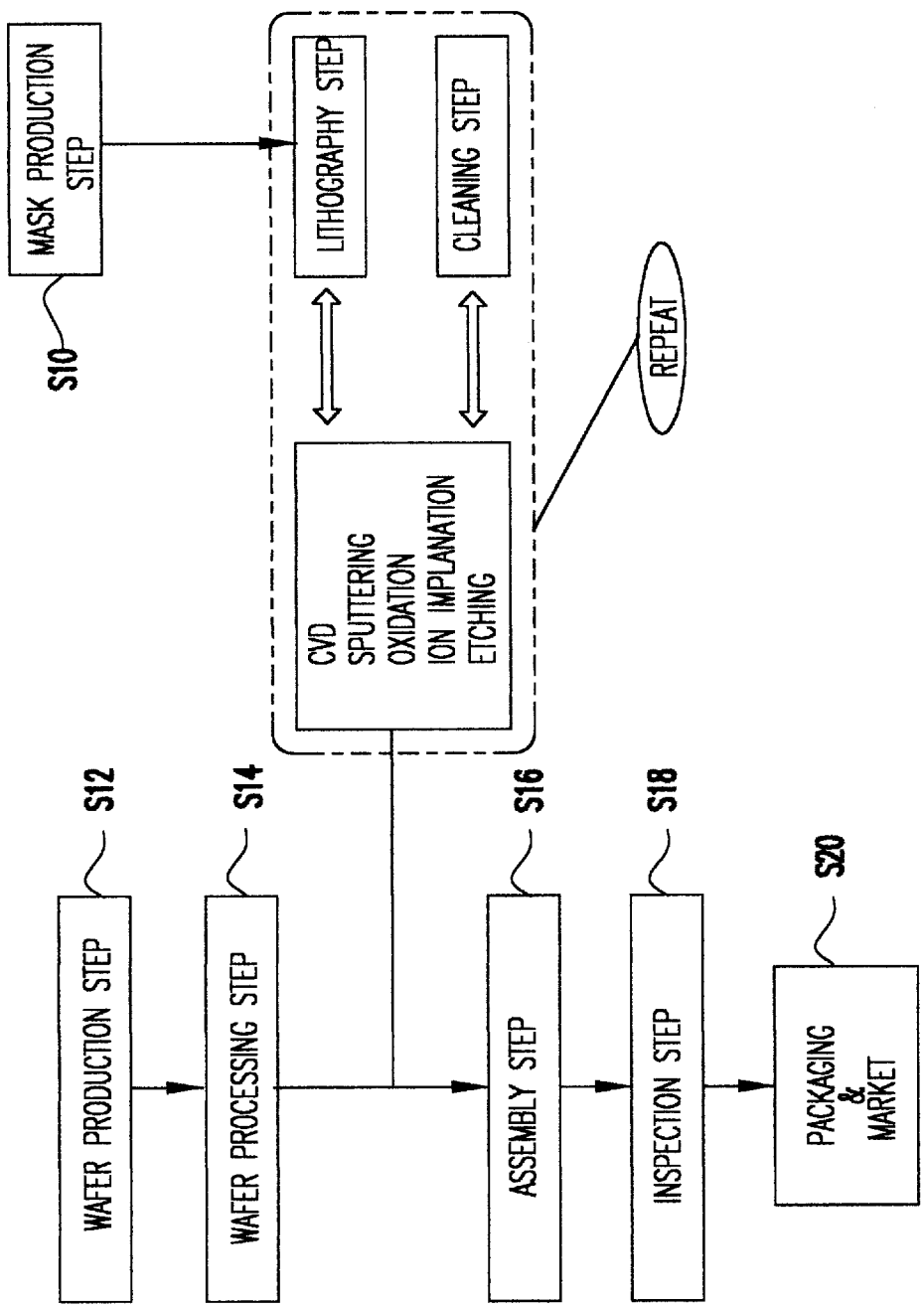
FIGS. 5A and 5B illustrate a generalized semiconductor manufacturing process which yields unexpectedly improved results by utilization of the invention.

FIG. 5A shows a generalized flow diagram providing an overview of the fabrication process for a semiconductor device (or apparatus) utilizing the invention. It is well understood by one of ordinary skill in the art that FIG. 5A may equally represent a high level block diagram of a fabrication process of a semiconductor device. It is also well understood that the high level block diagram represents a preferred although generalized fabrication method and that other fabrication methods may be equally used with the present invention. Details of particular fabrication methods are unimportant to the practice of the invention; however, at least one lithographic exposure is invariably required to determine device locations and dimensions. When the lithographic process is carried out in accordance with the invention described above, more accurately located patterns can be achieved consistent with high throughput in manufacture of integrated circuits of increased functionality and improved performance, which are not otherwise producible with other currently known lithographic techniques that do not include utilization of the invention.

Referring now to FIG. 5A, the semiconductor device fabrication begins with a mask fabrication at step S10. The mask fabrication comprises patterning a mask by known methods such as, for example, resist coating, electron beam or electromagnetic energy exposure, development, etching, resist stripping and the like. Upon completion of the mask fabrication, the mask is inspected and corrections to the mask are made, if necessary. In order to correct any defects that may be present in the mask, the patterning of the mask would again be performed subsequent to inspection. The finished mask (or reticle) is then used for wafer processing at step S14.

Wafer fabrication typically comprises growing a single crystal and performing mechanical processes on the grown crystal. These mechanical processes may include, for example, slicing or cutting a wafer and rounding the edges. The wafer is then polished and well known thermal processing is performed thereon as may be desired, for example, to getter impurities and or contaminants, repair crystal damage or the like. Thereafter, the wafer is inspected for defects.

Once the wafer is fabricated and only a predetermined small amount of tolerable defects are found, wafer processing begins at step S14. Wafer processing includes providing a thin film on a wafer for providing a circuit element. The thin film may be formed on the wafer by, for example, evaporation or sputtering deposition, CVD (chemical vapor deposition), ion implantation and the like depending on the intended material of the film. Once the thin film is deposited on the wafer, modification to the thin film is performed in order to provide the thin film with certain defined electrical properties, if necessary. The modification of the thin film may include, for example, etching to form circuit patterns, oxidation to form an insulator or doping to control conductivity. Doping may be performed by any well known method such as ion implantation, thermal diffusion, deposition of a doped film and the like.

It is well understood by one skilled in the art, that the wafer may be washed after the wafer process (e.g., etching, deposition, implantation and the like). It is also understood that several processing steps, such as, for example, two or more CVD processing steps or the like may be performed, and that the washing of the wafer may be performed between each of these individual processing steps, if desired. The washing and processing of the wafer may be repeated any number of times, and is limited only by the design and intended use and function of the finished device.

The thin film is patterned using the mask fabricated in step S10. The patterning of the thin film includes exposing the resist layer, via a lithographic process (e.g., charged particle exposure), to form a latent image on the resist. The charged particle exposure is discussed in detail with reference to FIG. 5B. It is further well understood that the charged particle exposure selectively modifies the resist in a predetermined pattern by altering the chemical composition of the resist. The resist is then developed to form a pattern in accordance with the exposure and inspected for any defects. The invention, by providing for substantially symmetric heating of the blanking aperture, particularly in comparison with the necessarily highly asymmetric heating of prior blanking arrangements, eliminates or minimizes variation of sequential exposure locations to levels which are insignificant relative to present and foreseeable minimum feature sizes and greatly improves the stitching together of sequential sub-field or shaped beam exposures to a degree not previously attainable.

The invention thus improves manufacturing yields by substantially or fully eliminating positional errors of exposures due to variation in exposure tool geometry and thus provides improved lithographic patterning substantially free of irregularities where features cross sub-field edges as would be determined by inspection after resist development.

After inspection, the wafer is baked to stabilize the resist pattern, and after the desired processing (e.g., etching, deposition, implantation and the like), the resist may be stripped and the wafer washed, if necessary.

The charged particle exposure associated with step S14 may be repeated any number of times in order to provide numerous thin film layers having certain defined electrical properties in patterned areas of each such layer. Moreover, the wafer may be washed after each individual charged particle exposure process. Depending on the specific application, the wafer may then be coated with an insulative layer and provided with a contact hole (e.g., through hole).

In step S16, the patterned wafer is assembled into a device. This process includes testing, inspecting and dicing the wafer, and providing bonding to the chips diced from the wafer. Bonding includes connecting a lead wire for connection to an electrode, semiconductor device or other component. The assembled semiconductor chip is then packaged (e.g., sealed) to stabilize the semiconductor chip and inspected for any defects. In step S18, the assembled semiconductor chip is inspected and tested, and introduced into the marketplace in step S20.

Figure 5B:
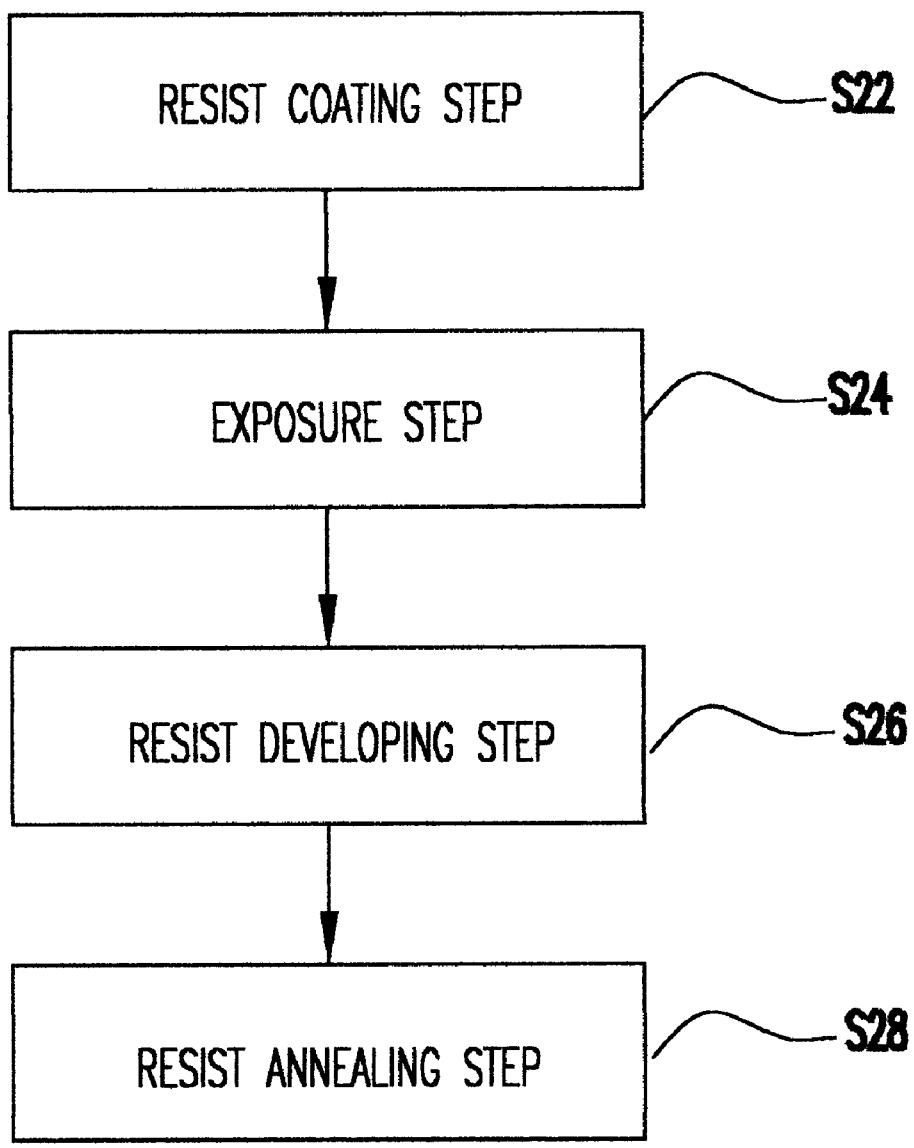

FIG. 5B shows the detailed process of resist pattern formation as shown with relation to the resist pattern formation of step S14 of FIG. 5A. As is well understood by those of ordinary skill in the art, the lithographic process of steps S22–S26 is invariably included to define latent images on the resist, and that the patterning of the resist is critical to the overall design of the device regardless of the technology that may be used to develop such latent images on the resist since the location and basic dimensions of electron elements and conductors are established thereby. To this end, at step S22, the step of resist coating is shown. At step S24, the resist is exposed to electron means utilizing the mask formed in step S10 of FIG. 5A with greatly improved accuracy of exposure location through utilization of the invention. This exposure is performed, for example, by an electron beam stepper device in which the invention may be installed. At step S26, the resist is developed to form a pattern in accordance with the exposure of step S24. At step S26, the resist in then annealed. Once such a pattern is formed, the semiconductor fabrication process continues as described above.

In view of the foregoing, it is seen that the invention provides a simple and straightforward method and apparatus for rapidly blanking and unblanking an electron beam projection lithography tool capable of high throughput while maintaining consistent and symmetrical thermal conditions therein to prevent changes or instability in the geometry thereof. Utilization of the invention provides geometrical stability and repeatability of beam position to a tolerance below measurable levels and far below any significant fraction of 0.1 microns while permitting lithographic exposures to be made at a very rapid rate. It should be understood that while the invention has been described in connection with it preferred application to an electron beam projection lithography tool, the invention is similarly applicable to any device requiring a high current or power charged particle beam to be blanked, such as a probe-forming electron or ion beam tool.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of operating a charged particle beam device including steps of
   generating a beam of charged particles at an aperture in an aperture diaphragm,
   deflecting the beam of charged particles away from said aperture,
   deflecting the beam along a portion of a locus on a surface of said aperture diaphragm, said locus being geometrically closed surrounding said aperture and approximately symmetrical around said aperture, and
   deflecting the beam from a location on said locus to said aperture.

2. A method as recited in claim 1, wherein said locus is octagonal.

3. A method as recited in claim 1, wherein said locus is square.

4. A method as recited in claim 1, wherein a minimum distance between said locus and an edge of said aperture is at least twice a transverse dimension of said beam of charged particles.

5. A method as recited in claim 1, wherein said step of deflecting said beam along said locus includes the step of
   sequentially applying a deflection voltage to each of a plurality of deflection plates located around an axis of said beam of charged particles.

6. A method as recited in claim 5, wherein said step of sequentially applying a deflection voltage to a plurality of deflection plates further includes the step of
   applying said deflection voltage to two adjacent deflection plates simultaneously.

7. A method as recited in claim 1, wherein said charged particle beam is an electron beam.

8. Apparatus for blanking an electron beam including
   an aperture diaphragm having an aperture,
   means for producing a charged particle beam at said aperture, and
   means located above said aperture diaphragm for deflecting said charged particle beam in a two-dimensional pattern on said aperture diaphragm along a locus spaced approximately symmetrically around said aperture in said aperture diaphragm.

9. Apparatus as recited in claim 8, wherein said locus is octagonal.

10. Apparatus as recited in claim 8, wherein said locus is square.

11. Apparatus as recited in claim 8, wherein said means for deflecting said beam along a locus comprises a plurality of deflection plates located around an axis of said beam of charged particles, said apparatus further including
    means for sequentially applying a deflection voltage to each of said plurality of deflection plates.

12. Apparatus as recited in claim 11, further including
    means for applying said deflection voltage to two adjacent deflection plates simultaneously.

13. Apparatus as recited in claim 8, wherein said charged particle beam is an electron beam.

14. A method of fabricating an integrated circuit device including the steps of
    generating a beam of charged particles at an aperture in an aperture diaphragm,
    deflecting the beam of charged particles away from said aperture,
    deflecting the beam along a locus on a surface of said aperture diaphragm which is approximately symmetrical around said aperture,
    deflecting the beam from a location on said locus to said aperture to expose a resist on a wafer to form a latent image in said resist,
    developing said latent image to form a resist pattern, and
    processing said wafer in accordance with said resist pattern.

15. A method as recited in claim 14, wherein said locus is octagonal.

16. A method as recited in claim 14, wherein said locus is square.

17. A method as recited in claim 14, wherein a minimum distance between said locus and an edge of said aperture is at least twice a transverse dimension of said beam of charged particles.

18. A method as recited in claim 14, wherein said step of deflecting said beam along said locus includes the step of sequentially applying a deflection voltage to each of a plurality of deflection plates located around an axis of said beam of charged particles.

19. A method as recited in claim 18, wherein said step of sequentially applying a deflection voltage to a plurality of deflection plates further includes the step of applying said deflection voltage to two adjacent deflection plates simultaneously.

20. A method as recited in claim 14, wherein said charged particle beam is an electron beam.

* * * * *